219-121 SR

MTR04 XR 3,648,048

United States Patent

Cahan et al.

[15] 3,648,048

[45] Mar. 7, 1972

[54] SYSTEM AND METHOD FOR POSITIONING A WAFER COATED WITH PHOTORESIST AND FOR CONTROLLING THE DISPLACEMENTS OF SAID WAFER IN A SCANNING ELECTRON APPARATUS

[72] Inventors: Olivier Cahan, Gif-sur-Yvette; Jean-Edgar Picquendar, Saint-Remy-Les Chevreuse; Georges Pircher, Gif-sur-Yvette, all of France

[73] Assignee: Compagnie Francaise Thomson Houston-Hotchkiss Brandt, Paris, France

[22] Filed: Oct. 15, 1969

[21] Appl. No.: 866,506

[52] U.S. Cl. ....................................250/49.5 A, 250/49.5 B

[51] Int. Cl. ....................................H01j 37/20

[58] Field of Search ....................250/49.5 B, 49.5 A, 49.5 T

[56] References Cited

UNITED STATES PATENTS 2,496,051 1/1950 Hellier ....................250/49.5

3,179,799 4/1965 Valdre ....................250/49.5

*Primary Examiner*—James W. Lawrence

*Assistant Examiner*—C. E. Church

*Attorney*—Flynn & Frishauf

[57] ABSTRACT

System and method for positioning a wafer coated with photoresist and for controlling the displacements of this wafer in a scanning electron beam apparatus such as a scanning electron microscope. In this system, the sample holder of the scanning electron microscope comprises, in addition to the conventional micrometer mechanisms, three piezoelectric actuators as fine adjustment means for positioning the wafer in two orthogonal directions and in rotation. The sample holder is further coupled to three interferometers which are located within the evacuated enclosure of the microscope and are monitored by a set of fringe counting units located outside the enclosure. The provision of a programmer and of a servocontrol system allow the displacements of the wafer to be automatically controlled and measured.

6 Claims, 3 Drawing Figures

Figure 1:
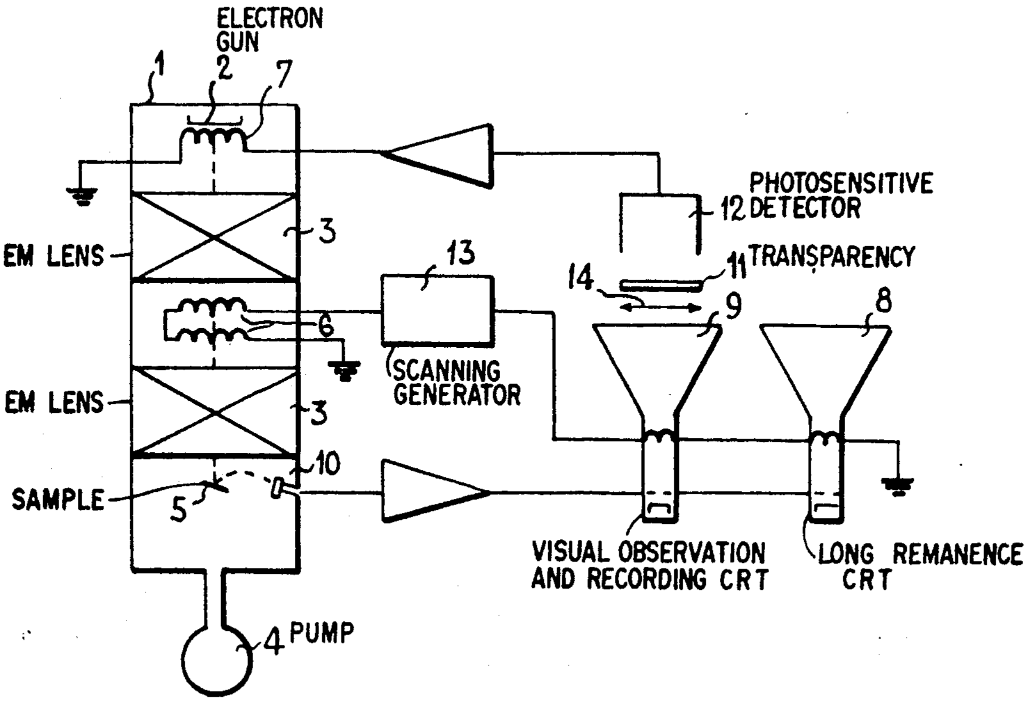

SYSTEM AND METHOD FOR POSITIONING A WAFER COATED WITH PHOTORESIST AND FOR CONTROLLING THE DISPLACEMENTS OF SAID WAFER IN A SCANNING ELECTRON APPARATUS

The present invention deals with improvements to systems and processes for the imprinting of photosensitive surfaces, by exposure to electron beams, in particular for masking wafers of silicon or other semiconductor material in the manufacture of semiconductor devices such as diodes, transistors and integrated microcircuits.

The masking of semiconductor wafers is generally carried out by a photolithographic process utilizing a photoresist, a resin which becomes acid resistant when it has been exposed to actinic radiations. When an image is projected upon a wafer of silicon, previously oxidized and coated with photoresist, the photoresist hardens and adheres only where the image is clear, but can be removed by simple washing of the dark regions of the image. A perforated oxide layer constituting a mask is then obtained by subjecting the wafer to acid attack in the course of which the oxide is eliminated in the regions where the photoresist is not polymerized. Owing to this mask, the unprotected regions can be modified, for example by the diffusion of impurities, so as to become constitutive regions of semiconductor devices. In general, a very large number of devices are prepared on the same wafer, and each of them can measure a mere fraction of a millimeter.

When the photoresist is sensitized by light rays, the best resolution which may be obtained for the mask is limited to about 0.5 microns by the diffraction of the light. But, in consequence of various effects: diffusion of the light into the resin, effects of the edges, etc..., the resolution is in practice limited to a value of about two microns, which if often insufficient to allow a high level of precision.

Since the photoresists are generally electronsensitive as well as light sensitive, various attempts have been electron sensitive to sensitize the resin with electron beams, in order to remove the limitations on the resolution which are imposed by light. The techniques which have been developed for this are in general making use of a scanning electron microscope or of a similar fine electron beam apparatus.

A scanning electron microscope usually comprises a chamber housing an electron gun and electromagnetic lenses. A pump allows the enclosure to be evacuated. The beam of electrons proceeding from the gun and focused by the lenses forms a very small spot at a location where a sample 5 is placed. Deflecting coils, likewise housed in the chamber, serve to produce a sweeping or scanning action of the spot.

The diameter of the spot, normally in the neighborhood of 0.1 micron can be adjusted between 0.02 and 2 microns. The scanning, of 1,000 lines for example, may cover a square of about 100 to 2,000 microns side, however, the dimension of this square is preferably selected to be between 150 and 500 microns. Naturally, the larger the surface scanned, the more difficult it is to preserve a fine spot. A suppressor coil 7 can be placed between the electron gun and the first lens in order to cut off the beam of electrons by the application of pulses, without acting on the supply.

A single generator simultaneously supplies scanning signals to the deflecting coils of the microscope and to those of two cathode-ray tubes; one of them, with strong remanent characteristics, is used for visual observation and the other, for photographic recording.

On impinging upon the sample, the electrons in the beam give rise to a secondary emission of electrons. The secondary electrons are detected by a photomultiplier whose output signals are employed as video signals to modulate the brilliance of the cathode-ray tubes. "Secondary emission images" are thus formed on the screens of these tubes.

Excellent images are thus obtained without preparation of the sample, and with a magnification as high as that of the best microscopes.

In addition, on the "secondary emission images," it is possible to see the junctions as well as the distribution of potentials on the surface of a semiconductor wafer. In consequence, microscopy by electronic scanning is of great interest among techniques connected with the manufacture of microcircuits and semiconductor devices.

A scanning electron microscope can also serve to mask of semiconductor wafers. For this purpose, it is appropriate to place the wafer, oxidized and coated with photosensitive resin, in place of the sample. The modulation of the electron beam in the microscope according to the two tones or shades of the image of a mask can be achieved by means of the simultaneous scanning in the microscope and in the viewing oscilloscope. Conveniently, in front of the screen of the recording CRT a lens is placed, then a transparency imaging a large scale negative replica of the mask, then a photosensitive detector delivering an output signal which, after amplification, is applied to the beam suppressor coil. On this system, a transparent region of the transparency allows the electron beam to scan the wafer, while an opaque region causes the disappearance of the beam. The negative replica of the mask thus transposed, on a smaller scale, onto an area of the wafer equal to the surface scanned.

A much better resolution than with optical means is thus obtained, without deviating from normal values for the dimension of the electronic spot or for the area of scanning.

Nevertheless, for the resolution desired, the area of scanning is relatively small and covers only the location of a single integrated circuit or other semiconductor device. In order to record a complete mask, it is necessary to repeat many times, by successive translations of the semiconductor wafer, the imprinting of an elementary figure or pattern having a surface smaller than the area scanned. In addition, the processing of the devices often necessitates successive masking operations, between which manufacturing operations such as diffusions take place; it is essential that the wafer can be located repeatedly under the beam in a specified position in order that the corresponding elementary patterns of successive masking operations are superimposed with the greatest possible accuracy.

The micrometer mechanisms and measuring devices which are normally fitted to microscopes have been shown to be ineffective, up to the present, to produce and measure translational movements of the wafer relative to a fixed point in the beam, and also to allow the wafer to be located repeatedly in the same position relative to the beam and relative to the direction of scanning, taking into account that it is desirable that the accuracy should be of the same order of magnitude as the desired resolution. It is for this reason that it has not been possible, up to the present time, to profit from all the advantages offered by the application of electronic scanning to the masking of semiconductor wafers.

The present invention aims, principally, to apply improvements to the processes and apparatus of scanning electronic microscopy, so as to remedy the above disadvantages. It is likewise proposed by the invention to render the cycle of operations connected with the manufacture of masks automatic.

It will be understood that the scanning electron microscope or other electron beam apparatus utilized in the invention includes, within its evacuated enclosure, a sample holder comprising a wafer support which is placed so as to have at least two lateral surfaces approximately parallel to the displacement directions (X, Y) of two cross carriages provided with micrometer positioning means.

SUBJECT MATTER OF THE INVENTION

The wafer support is linked to the carriage assembly through fine adjustment actuators placed between said lateral surfaces and a retaining member of the carriage assembly. Furthermore, interferometers are located within the evacuated enclosure of the microscope with their mobile mirrors on said lateral surfaces and with their fixed mirrors on a part of the microscope which is rigidly linked to a fixed point in the electron beam, and these interferometers are coupled through a transparent window to a set of bidirectional fringe counting apparatus located outside the evacuated enclosure. Preferably, the actuators comprise piezoelectric ceramic slabs of the barium titanate type. The positioning means of the cross carriages may be controlled by motors located outside the evacuated enclosure of the microscope.

The control of the displacements of the wafer is achieved through adjustment of the micrometric positioning means, and also of the biasing signals of the actuators. The measures of the displacements are obtained from the counts of fringes on the fringe counters. Accurate positioning of the wafer on its support may be repeatedly achieved by operating the electron beam apparatus in the microscope mode and by watching on the viewing oscilloscope the coincidence of marks traced on the wafer with a mark traced on the oscilloscope screen.

The system may include an automatic control and a programmer for operating the motors of the carriage assembly and the bias of the actuators, so as to provide fully automatic controls and measures of the displacements.

The invention will be more fully understood with the aid of the following description, given by way of a nonlimitative example and illustrated by the following figures:

FIG. 1 is a diagrammatic representation of the positioning system as is shown diagrammatically in FIG. 1, a scanning electron microscope comprises a chamber 1 housing an electron gun 2 and electromagnetic lenses 3. A pump 4 allows the enclosure to be evacuated. The beam of electrons proceeding from the gun and focused by the lenses forms a very small spot at a location where the sample 5 is placed. Deflecting coils 6, likewise housed in the chamber, serve to produce a sweeping or scanning action of the spot.

A single generator 13 simultaneously supplies scanning signals to the deflecting coils 6 of the microscope and to those of two cathode-ray tubes 8, 9; one of them, 8, with strong remanent characteristics, is used for visual observation and the other, 9, for photographic recording. A photomultiplier 10 detects secondary electrons. 14 is a lens, 11 a transparency and 12 a photosensitive detector.

Figure 2:
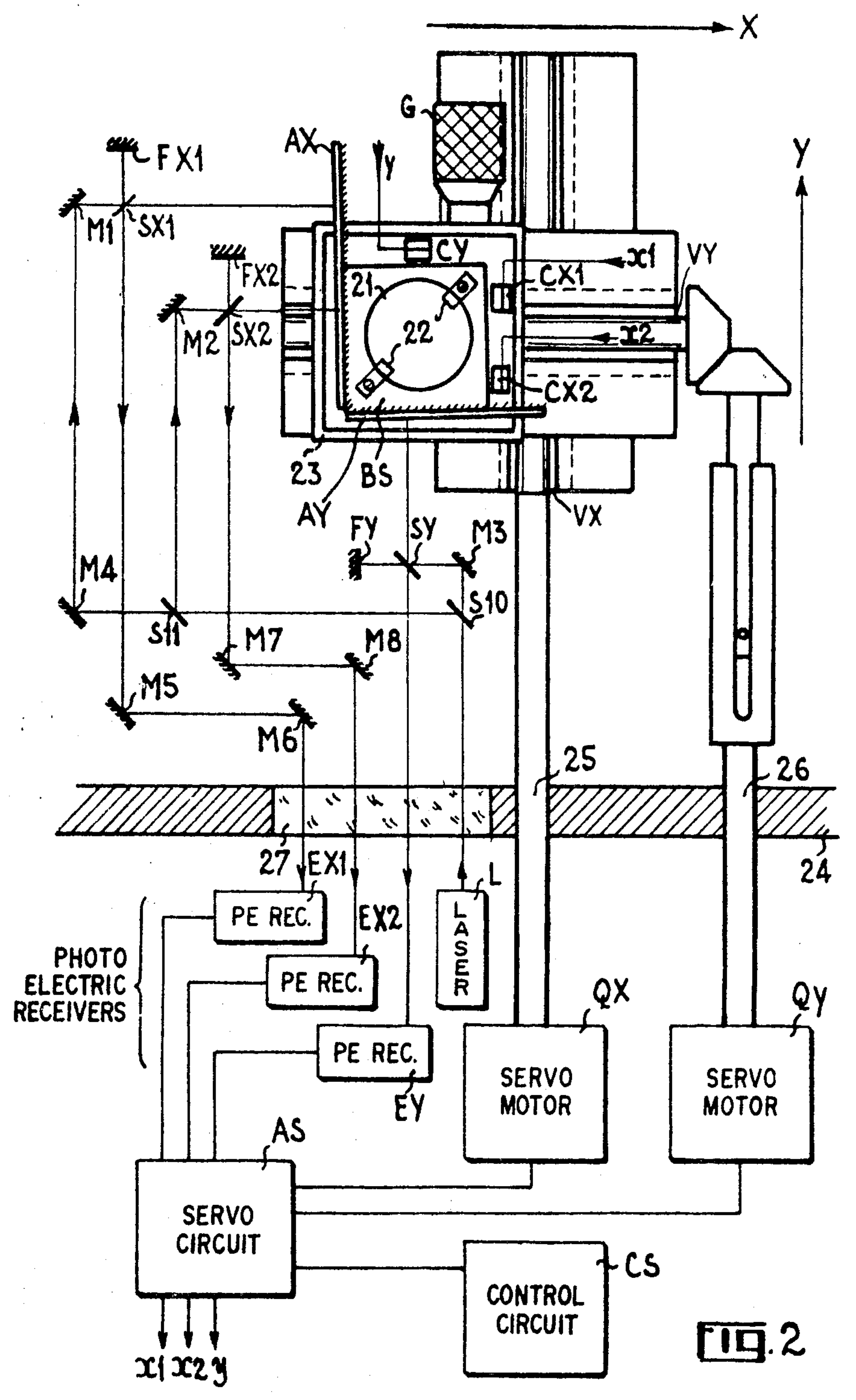

FIG. 2: a simplified representation of the sample carrier of a scanning electron microscope modified in accordance with the invention.

Figure 3:
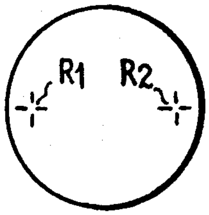

FIG. 3: a plan view of a silicon disc provided with markings for its location.

In order to carry out masking on a semiconductor disc in accordance with the invention, an assembly composed of elements illustrated diagrammatically in FIG. 1 may be used, but with a scanning electron microscope comprising a sample carrier which has been modified in accordance with FIG. 2.

In FIG. 2 can be seen a support block BS, almost cubic, on the upper face of which is fixed, with the aid of clips 22, a part which is intended to receive a mask, that is, a disc of silicon 21, oxidized and coated with photosensitive resin. The disc 21 occupies the place of the sample in the enclosure of the scanning electron microscope. The wall of this enclosure is shown partially at 24. The lower part of the block BS is placed within a frame 23; the block BS and the frame 23 are connected mechanically to each other through the intermediary of three actuators CX1, CX2 and CY: the actuators are interposed between the faces of the block and the frame; two of the actuators CX1 and CX2 are between the faces perpendicular to the X axis and the third actuator CY between the faces perpendicular to the Y axis. The block BS and the frame 23 are of a metal having a low coefficient of thermal expansion such as invar. The actuators may be of the hydraulic type or, preferably, of the piezoelectric type. Piezoelectric actuators are known devices comprising slabs of a ceramic such as barium titanate, having the property of expanding under the action of an electric field. In FIG. 2, each actuator is formed from two ceramic slabs in parallel; electrical signals $x1$, $x2$ and $y$ are provided for biasing the actuators. It is recommended that the actuators be shielded so as to avoid their being exposed to stray fields, or creating them. It will be understood that a variation of the biasing signal of the actuator CY for example causes a variation in the expansion on this actuator, and consequently a displacement of the support block BS relative to the frame 23, parallel to the Y axis; the amplitude of the displacement is small but sufficient to finalize the adjustments effected previously with the aid of micrometer mechanisms. In FIG. 2, the angular scale between the faces of the block BS and those of the frame 23 has been exaggerated so as to show more clearly that an unequal biasing of the two actuators CX1 and CX2 causes a slight rotation of the block relative to the frame. The frame 23 is mounted on a goniometer, or angular adjustment head, which is not shown, and then on a crossed carriage system. The goniometer, manually adjustable with the aid of the knob G, produces the preliminary adjustment of orientation. The crossed carriages can be moved in the X and Y directions respectively (and over distances at least equal to the diameter of the disc 21) with the aid of micrometer screws VX and VY, driven by servomotors QX and QY. The motors QX and QY are outside the evacuated enclosure of the microscope and their transmission shafts 25, 26 pass through the wall 24 in vacuum-sealed glands. The shaft 26 is connected to the screw VX by a 90° transmission.

The wall 24 of the microscope comprises a transparent window 27. A laser L, preferably of the stabilized unimode type, placed outside, transmits through the window a ray of light which, inside the enclosure, illuminates the three interferometers simultaneously through the intermediary of two half-silvered mirrors S10, S11 and four mirrors M1, M2, M3, M4. The interferometers are of the Michelson type, comprising a fixed mirror, a moving mirror and a half-silvered fixed mirror. The fixed mirrors and the half-silvered mirrors make up three groups, two of which FX1, SX1 and FX2-SX2, are arranged alongside the face of the block BS, opposite that which is supported on two piezoelectric actuators; the third group FY-SY is placed alongside a perpendicular face of this block. The groups of fixed mirrors are rigidly connected to a part of the microscope (not shown) which is fixed and expands but little (for example, of invar), and which is firmly attached to the outlet diaphragm of the electron beam. The moving mirrors AX and AY are fixed firmly to the perpendicular faces of the block BS alongside which the groups or fixed mirrors are situated. There are only two moving mirrors, since one of them, AX, is common to the two interferometers placed alongside the same face. The moving mirrors AX, AY need to be rigidly fixed to the support block, to have a high degree of flatness, and to form an angle of 90° precisely.

Light issuing from the interferometer associated with the moving mirror AY passes through the window 27 of the enclosure, then proceeds towards a receiver assembly EY. In a similar manner, the light issuing from the two interferometers associated with the moving mirror AX is transmitted towards receiver assemblies EX1 and EX2 respectively, with the aid of a set of mirrors M5, M6, M7, M8. These receiver assemblies are outside the evacuated enclosure of the microscope 5.

When the support block BS moves relative to the electron beam discharge orifice, the intensity of the light proceeding from the interferometers varies sinusoidally, due to the succession of interference fringes; the counting of the interference fringes, carried out by the receiver assemblies, allows the displacement of the support block to be measured. The receiver assemblies EX1, EX2, EY have a known construction and comprise, for example, photoelectric receivers followed by circuits for differentiating the direction of movement. In these circuits, a counter allows a position to be determined with a precision higher than 0.1 microns.

The receiver assemblies EX1, EX2, EY give a direct reading of the numbers of fringes or even fractions of fringe. These numbers are also translated into electrical signals which may be utilized for automatic on remote monitoring. It is apparent from the outset that:

the numbers of fringes counted by the assembly EY may serve to measure a displacement of the support block along the Y axis;

those counted by one or the other of the assemblies EX1 or EX2 may serve to measure a displacement along the X axis;

the difference in the numbers of fringes counted respectively by the assemblies EX1 and EX2 may serve to evaluate rotation of the support block.

The output signals of the receiver assemblies EX1, EX2, EY are applied to a servo circuit AS comprising conventional circuits for controlling the motors QX, QY and the biasing signals $x1$, $x2$ $y$ as a function of the error between predetermined numbers of fringes and the numbers of fringes indicated by the receiver assemblies. In addition, components, not shown, permit manual control of the motor supplies and of the biasing signals.

The servo circuit A5 may be connected to a control circuit CS, which is capable of controlling the sequence of operations of the servo circuit, in accordance with a program.

Modifications have thus far been described which, in accordance with the invention, need to be applied to a scanning electron microscope. The description now deals more particularly with the masking of the silicon disc 21.

As has been stated already, the electronic scanning covers a small area of the disc, and this surface contains only one elementary figure or pattern of the mask. A complete mask may be made up of a large number of elementary patterns arranged in the form of matrix and it is necessary to impart a translational movement to the disc, equal in extent to the pitch of the patterns, after the imprinting of each figure, so that successive scanning operations cause the impressing in succession of all the figures in the mask. The translation of the disc may be carried out along the X axis so as to produce a line of figures, then along the Y axis so as to pass on to the next one.

In accordance with the invention, the operating cycle may be performed automatically. For this purpose, a program of sequential operations is applied to the control circuit CS, in accordance with which program the servo circuit AS periodically operates the motors QX and QY in accordance with predetermined numbers of fringes. If required, the motor supplies can also be controlled manually, and the number of fringes corresponding to the displacement of this disc may be read on the counter assemblies EX1, EX2, EY.

However, since the accuracy of the mechanisms driven by the motors is much lower than the accuracy of the measurements derived from the counting of the fringes, it is advisable to stop the motors before the full count of the fringes is reached. Then, the biasing signals $x1$, $x2$, $y$ of the actuators will be adjusted in a sense such that the ensuing expansion of the actuators will drive the disc toward the desired location, until this location is reached. Such an adjustment of the biais can likewise be produced automatically.

When the biasing signals of the actuators are adjusted in response to predetermined numbers of fringes, automatic compensation for the random displacements which may result either from mechanical clearances or from thermal expansion will take place. The compensation will act along the X and Y axes, as well as in rotation; in this latter case, the compensation results from an unequal variation in the biasing signals of the actuators CX1 and CX2.

The expansion or contraction of the actuators can produce extremely small displacements, smaller than the width of the fringes; these displacements are measured by interferometry with an accuracy which is likewise lower than the width of the fringes. Consequently, the overall accuracy may easily be better than 0.1 microns, this accuracy being conditioned also by the dimension of the electronic spot and by the area of the electronic scanning.

It should also be noted that the displacements are measured relative to a fixed point in the electronic beam which can be situated on the outlet orifice for this beam, since the fixed mirrors of the interferometers are rigidly connected to the output diaphragm of the beam, that is to say, to a part which is fixed relative to the beam.

If only one mask is to be formed on a disc, it may be believed to be unnecessary to measure the pitch of the figures with such accuracy. Yet the automation of the displacements is a certain advantage, since time is gained thereby.

The accuracy of positioning is important in the almost general case, where it is necessary to carry out successive masking operations, during which the disc is cleaned, and then submitted to treatments such as the diffusion of impurities into the regions of the disc which are not protected by the mask. In the course of the successive masking operations, masks are formed whose patterns, although generally different, can be superimposed, and it is absolutely necessary that all the patterns of the successive masks are superimposed upon the disc with the best possible accuracy. It is thus necessary for the pitch or spacing of the patterns to be as uniform as possible, and it has just been shown that the invention allows this object to be fulfilled. Furthermore, with each masking operation it is necessary to locate the disc upon its support, giving it a well defined position relative to a fixed point in the electronic beam.

In accordance with the invention, the disc can be adjusted to a predetermined position with respect to a fixed point in the electronic beam and with respect to the direction of scanning, repeatedly and with very high accuracy. In order to do this, two unremovable microscopic marks are traced on the disc, such as, for example, the marks R1, R2 at the ends of a diameter, in FIG. 3. A visible mark is also traced on the screen of the viewing cathode-ray tube 8 (FIG. 1), for example, in the center of that screen. The micrometer mechanisms of the microscope are operated so as to give the disc an orientation for which one and the other of the marks R1, R2 can be brought below the outlet orifice of the electron beam as a result of a translational displacement of the disc along the X axis. The disc is then reset in the position where the first mark R1 is bellow the orifice. The equipment is subsequently operated in the microscope mode, as scanning electron microscopes are conventially employed, and, while observing the coincidence of the mark on the screen of the cathode-ray tube 8 with the magnified image of the first mark on the disc, the motors QX, QY of the micrometer mechanisms are first operated, and then, when the limit of accuracy of the mechanisms is reached, the biasing signals $x1$, $x2$, $y$ of the actuators CX1, CX2, CX3 are adjusted until the coincidence of the marks appears to be complete. After this, the disc is moved translationally along the X axis by operating the motor QX until the magnified image of the second mark on the disc is very close to the mark on the viewing screen; this approach process can be perfected by adjusting the biasing signals $x1$, $x2$ of the actuators CX1 and CX2 to an equal extent and in the same direction, but it may also occur that, due to a fault in the alignment of the marks with the X axis, rotation of the disc is necessary in order for the two marks to come into coincidence; adequate rotation can generally be obtained by adjusting the bias of the actuators CX1 and CX2 to the same extent and in opposite directions or, if possible, to a suitable extent to cause the disc to turn in its plane about the first mark R1.

In this latter manipulation, the bias of the actuators CX1, CX2 and the operation of the motor QX may be controlled manually, but servocontrol may also be carried out if the number of fringes corresponding to the distance separating the two marks R1, R2, on the disc, has been displayed.

After the position of the disc has been adjusted in this way, the origin of coordinates is fixed on one of the marks on the disc, for example R1. For this purpose, the image of the mark R1 is set, or reset, in coincidence with the mark on the screen, and the fringe counters are set to zero. Then, in order to imprint the patterns upon the disc by electron-beam exposure, the microscope mode of operation which had been employed up to this time is abandoned for returning to the mode operation as a recording device in which the intensity of the electron beam is controlled, control being carried out by means of the arrangement shown in FIG. 1, comprising a controlling cathode-ray tube, a negative replica of the pattern and a photosensitive detector.

While positioning the disc into the appropriate location for the exposure of a first pattern, and then moving the disc translationally by distances equal to the pitch of the patterns, the displacements which are given as numbers of fringes are measured by watching the indications of the counter assemblies EX1, EX2 and EY. The operating cycle may also be carried out automatically, in a manner similar to that which has been described previously for the case where no repeated masking operations were provided for.

The position of a pattern of the mask can thus be fixed with an accuracy of one thousandth and possibly better, of the width of the area scanned by the beam. If, for example, the accuracy of about 0.1 microns is selected, the patterns of the mask may be about 100 microns square.

It is advantageous to select a whole number of interference fringes as the spacing of the patterns of the mask. A particularly suitable dimension is 324 microns, that is to say $2^{10}$ wavelengths of a helium-neon laser. The pattern may then be 162 microns square. A passage of about 100 microns can be reserved on each side of the patterns for interconnections. On a disc of silicon, $2^{10}$ patterns of this size occupy a square of 100 mm. side, and the remainder of the disc is available for interconnections.

The preceding description shows that the main advantage of the invention lies in the very high accuracy which it permits. This accuracy, allied to the rapidity and certainty of the operations in automatic functioning, allows a larger number of integrated microcircuits and other semiconductor devices to be formed on one wafer than has been possible hitherto.

Obviously, the process of the invention can be carried out with equipment in which the intensity of the electron beam is controlled as a function of time, for example by programming the deflection currents or by a scanning process similar to that of television instead of being controlled as in FIG. 1, as a function of the position of the spot on the controlling cathode-ray tube 9 with a negative 11 replica of the pattern to be formed and a photosensitive detector 12 for distinguishing the two complementary parts of control signal of the beam. If the figures of a mask are not all identical, control of the intensity of the beam can be produced by several groups of signals, supplied for example by several controlling of oscillographs, it being possible to switch these groups of signals to the input of the beam control device. With the purpose of reducing significantly the overall duration of the operation, an apparatus can be used comprising several fine electron beams, arranged in a square network having a mesh size of between 50 and 500 microns side. The invention can, in addition, be applied to the imprinting of any surface sensitive to electrons, as well as the layer of photosensitive resin covering a semiconductor disc.

It is to be understood that the invention is not limited by the description given above by way of example. Various other arrangements may be readily devised by those skilled in the art without departing from the spirit and scope of the invention.

What is claimed is:

1. System for positioning a wafer coated with photoresist and for controlling the displacements of said wafer in a scanning electron beam apparatus such as a scanning electron microscope which has, within its evacuated enclosure and on the path of the electrons, a sample holder comprising a mobile carriage assembly comprising two carriages displaceable respectively in two predetermined directions, one of said directions being perpendicular to the other with micrometric positioning means and a wafer support, said support being placed on the carriage assembly so as to have at least two lateral surfaces approximately parallel to the displacement directions (X,Y) of said carriages of the assembly, characterized in that the wafer support (BS) is linked to the carriage assembly through fine adjustment actuators (CX, CY) placed between said lateral surfaces and a retaining member (23) of the carriage assembly, and in that interferometers are located within the evacuated enclosure (24), said interferometers having mobile and fixed mirrors, the mobile mirrors (AX,AY) being located on said lateral surfaces and the fixed mirrors (5FX1, FX2, FY) being located on a part of the microscope which is rigidly linked to a fixed point in the electron beam, said interferometers being coupled through a transparent window (27) with a set of apparatus (EX1, EX2, EY) capable of counting fringes and of sensing the direction of displacement of said fringes, the count manifested by said set increasing for fringes displacing in one direction and decreasing for fringes displacing in the opposite direction located outside the evacuated enclosure (24).

2. System according to claim 1, characterized in that the actuators (CX, CY) comprise piezoelectric slabs of ceramic of the barium titanate type.

3. System according to claim 1, characterized in that the actuators (CX1, CX2, CY) and the interferometers are respectively one in number along one of the displacement directions (X or Y) of the crossed carriages, and two in number along the other direction.

4. System according to claim 3, characterized in that a mobile mirror (AX) is common to both interferometers (AX-EX1-SK1, AX-FX2-SK2) placed along the same direction.

5. System according to claim 1, characterized in that it comprises a laser (L) located outside the evacuated enclosure as the common source of light for all the interferometers, the light ray of the laser being distributed to the interferometers by a set of mirrors (M1....M8) within the enclosure).

6. System according to claim 1, characterized in that the micrometric positioning means of the cross carriages are controlled by motors (QX,QY) located outside the enclosure (24), the shafts of these motors passing through sealed passages (25,26) into the enclosure.

* * * * *

PO-1050
(5/69)

UNITED STATES PATENT OFFICE
CERTIFICATE OF CORRECTION

Patent No. 3,648,048 Dated March 7, 1972

Inventor(s) Olivier Cahen et al

It is certified that error appears in the above-identified patent and that said Letters Patent are hereby corrected as shown below:

The name of the inventor "CAHEN" is misspelled.
Correct name to read: Olivier CAHEN et al Page 1, add Item 32 Priority, October 25, 1968;
Item 33 France
Item 31 PV 171 342.

Signed and sealed this 25th day of July 1972.

(SEAL)
Attest:

EDWARD M.FLETCHER,JR.
Attesting Officer

ROBERT GOTTSCHALK
Commissioner of Patents